US012615061B2

(12) United States Patent
Zlotnik

(10) Patent No.: US 12,615,061 B2
(45) Date of Patent: Apr. 28, 2026

(54) INITIATOR IDENTIFIER COMPRESSION

(71) Applicant: Micron Technology, Inc., Boise, ID (US)

(72) Inventor: Leon Zlotnik, Camino, CA (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 18/618,082

(22) Filed: Mar. 27, 2024

(65) Prior Publication Data

US 2024/0333305 A1 Oct. 3, 2024

Related U.S. Application Data

(60) Provisional application No. 63/456,034, filed on Mar. 31, 2023.

(51) Int. Cl.
H03M 7/40 (2006.01)
H03M 7/30 (2006.01)
H03M 7/42 (2006.01)

(52) U.S. Cl.
CPC ........... H03M 7/42 (2013.01); H03M 7/6005 (2013.01)

(58) Field of Classification Search
CPC ....... H03M 7/42; H03M 7/6005; G06F 3/061; G06F 3/0659; G06F 3/0671; G06F 16/24568; G06F 16/2282
See application file for complete search history.

(56) References Cited

U.S. PATENT DOCUMENTS

| | | | | |
|---|---|---|---|---|
| 8,762,455 B2 * | 6/2014 | McCanne | ............... | H04L 67/56 |
| | | | | 709/228 |
| 11,399,194 B2 | 7/2022 | Surti et al. | | |
| 11,728,826 B2 * | 8/2023 | Pope | ....................... | H03M 7/40 |
| | | | | 341/51 |
| 2013/0262733 A1 * | 10/2013 | Boucard | ............. | G06F 13/4031 |
| | | | | 710/309 |
| 2021/0382847 A1 * | 12/2021 | De Lescure | ........ | G06F 13/1663 |
| 2022/0109454 A1 * | 4/2022 | Martin de los Santos | .................. | |
| | | | | G06F 3/0661 |
| 2022/0129265 A1 | 4/2022 | Appu et al. | | |
| 2025/0158749 A1 * | 5/2025 | Yilmaz | ............... | G06F 13/4022 |

FOREIGN PATENT DOCUMENTS

WO      WO-2021050875 A1 *   3/2021   .......... G06F 11/1471

* cited by examiner

*Primary Examiner* — Jean B Jeanglaude
(74) *Attorney, Agent, or Firm* — Brooks, Cameron & Huebsch, PLLC

(57) ABSTRACT

A method for initiator identifier compression includes associating respective initiator identifiers (IID) of a sub-set of initiators coupled via an interconnection structure to a target with respective parallel target data streams and performing, via an individual target data stream of the target data streams, an operation associated with the target and an individual initiator included in the sub-set of initiators.

18 Claims, 5 Drawing Sheets

100

110 — MEMORY SUB-SYSTEM

115 — MEMORY SUB-SYSTEM CONTROLLER

PROCESSOR
117

LOCAL MEMORY
119

INITIATOR IDENTIFIER COMPRESSION CIRCUITRY
113

120 —
HOST SYSTEM

PROCESSING UNIT
121

130 —
MEMORY DEVICE

LOCAL MEDIA CONTROLLER
135

• • •

MEMORY DEVICE
140

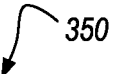
*350*

```
┌─────────────────────────────────────────────────────────────────────┐
│  ASSOCIATE RESPECTIVE INITIATION IDENTIFIERS (IID) OF A SUB-SET OF    │  352
│  INITIATORS COUPLED VIA AN INTERCONNECTION STRUCTURE TO A TARGET      │
│  WITH RESPECTIVE PARALLEL TARGET DATA STREAMS                         │
└─────────────────────────────────────────────────────────────────────┘

┌─────────────────────────────────────────────────────────────────────┐
│  PERFORM, VIA A TARGET DATA STREAM OF THE TARGET DATA STREAMS, A      │  354
│  MEMORY OPERATION ASSOCIATED WITH THE TARGET AND AN INDIVIDUAL        │
│  INITIATOR INCLUDED IN THE SUB-SET OF INITIATORS                      │
└─────────────────────────────────────────────────────────────────────┘
```

FIG. 3

INITIATOR IDENTIFIER COMPRESSION

PRIORITY INFORMATION

This application claims the benefits of U.S. Provisional Application No. 63/456,034, filed on Mar. 31, 2023, the contents of which are incorporated herein by reference.

TECHNICAL FIELD

Embodiments of the disclosure relate generally to memory sub-systems, and more specifically, relate to initiator identifier compression.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a flow diagram corresponding to a method for initiator identifier compression in accordance with some embodiments of the present disclosure.

DETAILED DESCRIPTION

Figure 1:
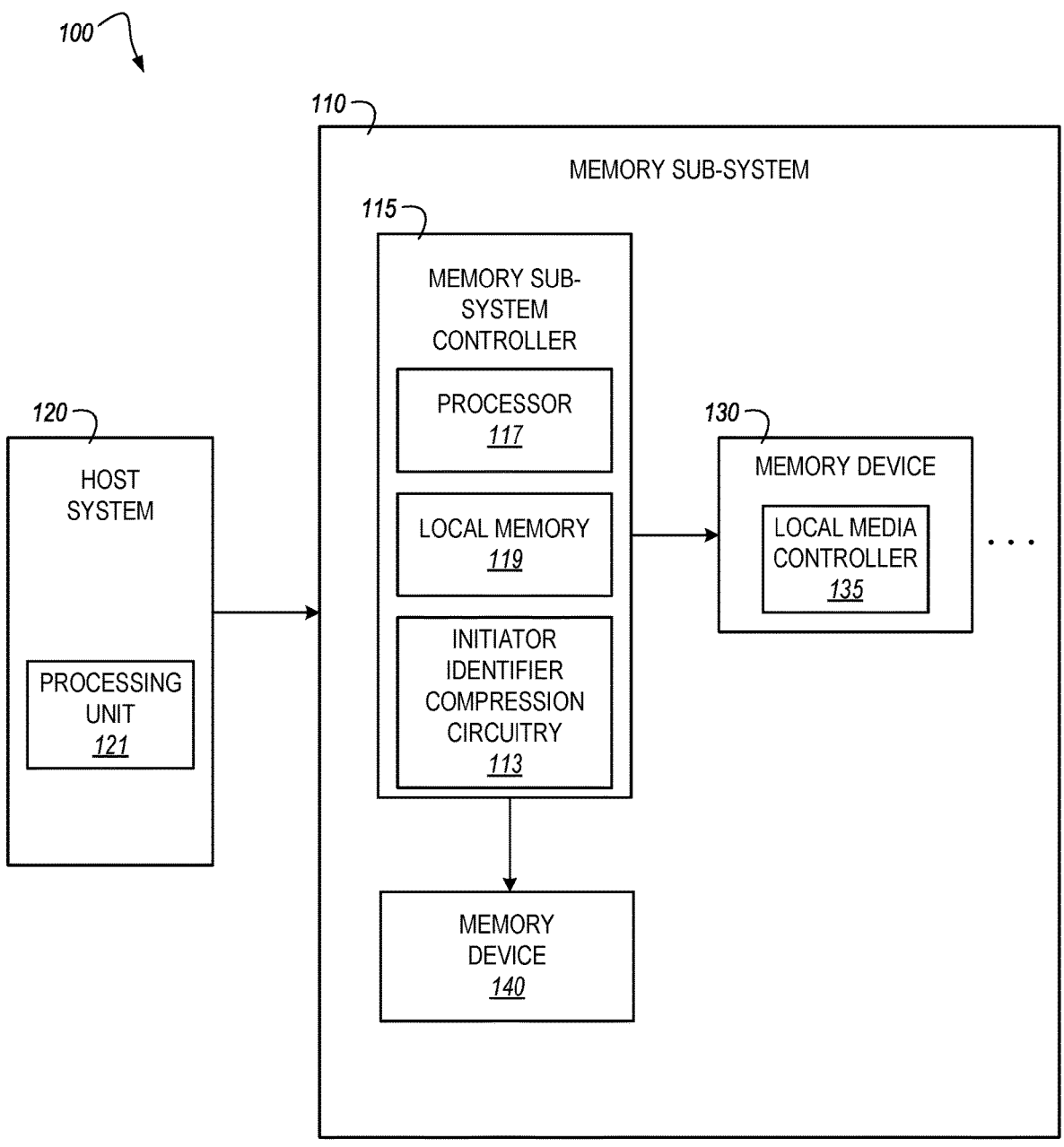
FIG. 1 illustrates an example computing system that includes a memory sub-system in accordance with some embodiments of the present disclosure.

Aspects of the present disclosure are directed to initiator identifier compression and, in particular to systems that include an initiator identifier compression component which is also referred to as "initiator identifier compression circuitry" herein. The initiator identifier compression circuitry can include a translation table, a compression component, and/or a decompression component, as described herein.

An interconnection structure such an interconnection fabric may connect various components (e.g., processor cores, memory devices, etc.) and/or can connect to other interconnection structures. The interconnection structure can include various hardware components such as a bus, set of buses, hardware interface(s), etc. For instance, an interconnection structure such as an interconnection structure can be employed in a system on a chip (SOC) or network on chip (NOC) configuration. The interconnection structure can permit data to flow effectively between the components via a plurality of parallel data streams (data channels), as is described in more detail below. A resource (e.g., a target such as a shared target) may be accessed via a serial data stream, via a parallel data stream, or via a combination of serial data streams and parallel data streams responsive to a request from an external requester (e.g., an initiator).

As used herein, parallel data stream or parallel target data stream refer to a quantity of out of order transaction requests that a given target can process at a particular time. As used herein, out of order transaction requests refer to a plurality of transaction requests (e.g., initiator requests) that are transmitted by different requesters to a target at different times. For instance, a target may process a quantity out of order transaction requests (e.g., read requests and/or write requests) at substantially the same time and/or in an overlapping manner to improve efficiencies and/or reduce an amount of latency associated with processing the transaction requests. As used herein, the term "substantially" intends that the characteristic need not be absolute but is close enough so as to achieve the advantages of the characteristic.

For example, out of order transaction requests can accumulate in a queue such as a first-in first-out cache (FIFO) until a sufficient quantity of a type of transaction request are received and/or until a quantity of transaction requests associated with the same location (e.g., the same memory bank, the same page, etc.) are accumulated. For instance, read operations (reads) or write operations (writes) to a given memory device may be grouped together to reduce any latency associated with switching on a bus or other interface to a different memory device. Similarly, reads/writes with a given page and/or a given bank may be grouped together to reduce any latency associated with opening/closing a given page and/or a given bank of a memory device. For instance, a quantity of queues such as a FIFOs can be employed (e.g., associated with given pages/banks) to group together the read/writes with a given page and/or bank to permit a plurality of reads/writes to be performed with the given page/bank prior to closing the given page/bank.

To facilitate out of order processing of transaction requests each initiator can have corresponding control information such as command identifier (ID) and an initiator identifier (IID) that is included with a transaction request (e.g., a command) sent from an initiator to a target. As used herein, a command identifier refers to information that is indicative of a type of command (e.g., a read or write command) and/or a type of information requested and/or included with the command. As used herein, an IID refers to numerical information or other information that identifies a specific initiator from a plurality of different initiators coupled to a target. For instance, the initiator may transmit a transaction request that includes a IID that is specific (unique to) the initiator.

Some approaches may seek to increase the quantity of targets, a quantity of initiators, or both. For instance, some approaches may seek to increase the quantity of initiators to increase performance of a memory sub-system. However, as the quantity of initiators and/or targets increases an interconnection structure coupled to the initiators may also be increased in scale. The increase in scale of the interconnection structure can have a corresponding increase in a quantity and/or size of physical connections (e.g., an increase in a quantity of wires, an increase in a width of a bus), an increase in computational power, an increase in traffic (e.g., traffic across a bus) and/or an increase in power consumed by components in an interconnection structure. For instance, a quantity of control information (e.g., a quantity of IIDs) can be increased in such approaches and thus may result in an increased amount of bus traffic and/or increased quantity of wires to route the transactions requests, increased quantity of logic (e.g., to route the transactions along the interconnection structure), and corresponding control information (e.g., IID) between initiators and a target. That is, in some approaches the transaction request and the control information may be sent from an initiator along an entirety of a path in the interconnection structure to the target such that the associated transaction request can be correctly routed to the target and the requested information and/or a confirmation of receipt of the transaction request can subsequently be routed back to a correct initiator once the transaction request is processed by the target. For instance, the control information (e.g., the IID) and in some instances additional information such as status and byte enables, etc., which indicate valid bytes of data, may be returned back to the initiator responsive to the target processing the transaction request. Additional information such acknowledge/confirmation information, among other information, can also be returned back to the initiator.

For example, some previous approaches may transmit respective control information such as a respective IID for each initiator (e.g., a total of 21 initiators) initiating a transaction request with a given IID to the target. However, the previous approaches may not be able to discern an amount of parallel target data streams which the target can process at a given time and/or may not readily permit arbitration (e.g., may result in inefficient and/or unfair arbitration) of the transaction requests. For instance, a target may permit a fixed quantity of parallel target data streams (e.g., four parallel target data streams) associated with a plurality of FIFOs (e.g., four FIFOs). Each target data stream may permit a plurality of transactions. As such, the target may permit up to four different initiators to post one more transaction (e.g., up to a total of 16 transactions from the one or more of the initiators) to the target at a given time via one or more of the parallel target data stream. For instance, up to four different initiators may be permitted to post respective transactions via a respective target data stream thereby resulting in the target permitting any quantity of transactions in a range from one transaction to sixteen transactions at a given time. Even so, in such instances any remaining transaction requests (e.g., a 17th transaction request from the same initiators and/or other initiators with different IID and/or any additional transaction requests from a 5th initiator) may not be permitted to post a transaction to the target (e.g., will be stalled and therefore will not be associated with any of the four parallel target data streams at the given time) despite the control information (e.g., IID) from 17th transaction being transmitted across an entirety of the interconnection structure to the target. Stated differently transmitting at least some of the IID (or in the worst case all of the IID) from the remaining transaction requests across an entirety of the interconnection structure results in an unnecessarily large amount of bus traffic, large quantity of logic, and/or large quantity of wires to permit such transmission between initiators and a target).

Due to having to potentially convey transactions requests and control information of a large quantity of initiators (e.g., up to 21 different initiators) such previous approaches may employ a large IID (5-bit) data string sufficient to convey each respective IID (e.g., 21 different IID for each different initiator and/or different IID for a plurality of transactions sent from each initiator). That is, in the above example a large (e.g., 5-bit) data string may be required to permit transmission of a plurality of unique IID (e.g., a unique 5-bit combination of binary data values) for each of the 21 different initiators. However, transmitting a large (5-bit) IID data string requires a corresponding increase in a quantity and/or size of physical connections (e.g., an increase in a quantity of wires, an increase in a width of a bus), computational power, traffic (e.g., traffic across a bus), an amount of logic, and/or power consumed by components in an interconnection structure. Yet, as mentioned, a particular target may have a fixed quantity of parallel target data streams (e.g., 2-bits and/or a FIFO that supports up to 4 parallel target data streams at a given point in time) that is less than a quantity of IID associated with initiators and thus less than a large (e.g., 5-bit) IID data string associated with each of the IID of the initiators. Therefore, at least a portion of the bits (e.g., a portion of the IID) will not be associated with a particular target data stream of the target at the given point in time. Such previous approaches may therefore not permit at least some of the initiators to post a transaction to the target (e.g., the transactions requests sent by the initiators that are not posted to the target data streams at a given time will be stalled). In the interest of clarity, while the above examples reference particular values (e.g., 5-bit, 2-bit) for the purposes of illustration of the concepts herein, it will be appreciated that other values may be employed (e.g., with respect to the a data string, the initiator(s) and/or the target(s)).

Conversely, some previous approaches may attempt to ensure that each target may process large IID data strings such as those that are larger than 2-bits. Thus, the previous approaches may seek to permit each of the initiators to post a transaction to a target data stream at a given time. However, such approaches are very expensive in terms of hardware and computational burden, and are rarely, if ever, employed to actually process the large IID data strings (e.g., which are larger than 2-bits) at a given time. Thus, such approaches may be prohibitively expensive, and may require an amount of computational power that detracts from overall operation of a memory sub-system, etc. Additionally, such approaches may result in inefficient and/or ineffective arbitration of the multitude of transaction requests from the initiators.

Generally, arbitration may be performed to provide initiators with access to a target such as a shared memory that is accessible by each of the initiators. For instance, some approaches may associate a fixed priority and/or a fixed weight arbitration system (e.g., in which different agents are allocated a particular priority) and/or may utilize a round robin-based approach to arbitration. In either case, the arbitration may not account for various factors relating to the target such as a fixed quantity of parallel target data streams that the target can process. As such, such approaches can result in unfairness in target usage and/or starvation of one or more initiator's ability to access to the target (e.g., stalling transaction requests associated with a given initiator at a disproportionate rate to other initiators). Such inefficient and/or unfair arbitration can become costly in terms of computing resource overhead (e.g., power, time, etc.) and can therefore reduce the overall performance of a computing system in which such methodologies are employed.

Additionally, some approaches may attempt to employ a large individual (single) arbitrator to arbitrate transaction requests for a target. For instance, the individual arbitrator can be an individual translation table and/or an individual compression/decompression mechanism that arbitrates each of the transaction requests from all initiators associated with a transaction with a given target or group of targets. However, such approaches may be inefficient and/or may result in a disproportionate increase in a quantity and/or size of physical connections, computational power, traffic, an amount of logic, and/or power consumed by components in an interconnection structure. For instance, a bus associated with an individual arbitrator and/or a bus associated with the target in such approaches may have a large width (e.g., 128 bytes) that is sufficient to accommodate transactions requests from each of the initiators, despite the target (e.g., a 32 byte target) having a given quantity of parallel target data streams that can only accommodate a small portion of the transaction requests at a given time. While a given time is referenced above, it is noted that in some embodiments, the initiators and targets can have different operational characteristics (e.g., different clocking speeds, different data bandwidth, etc.) and thus may operate at substantially the same given time. Moreover, approaches employing a single arbitrator may not be amenable to operation of a target with a plurality of target data streams, and therefore may reduce the overall performance of a computing system in which such methodologies are employed.

To address the above and other deficiencies, approaches herein employ initiator identifier compression that associates respective initiator identifiers (IID) of a sub-set of initiators coupled via an interconnection structure to a target with respective parallel target data streams and performs, via an individual target data stream of the parallel target data streams, an operation associated with the target and an individual initiator included in the sub-set of initiators. As used herein, a sub-set of initiators refers to a quantity of initiators that is less than a total quantity of initiators requesting transactions with the target. Notably, each initiator included in the sub-set of initiators can have at least one respective IID (e.g., a respective IID corresponding to each transaction request initiated by the initiator). That is, unlike the previous approaches, initiator identifier compression as described herein can compress (reduce) a total quantity of IIDs associated with a given target to a sub-set of IID associated with the sub-set of initiators. Thus, the sub-set of initiators (and corresponding sub-set of IID) may be less than a total quantity of initiators and respective IID associated with each of the transaction requests (each of the transaction requests sent from the initiators). Accordingly, approaches herein may yield a reduction in a quantity and/or size of physical connections (e.g., a quantity of wires, a width of a bus), a reduction in computational power consumed, a reduction in an amount of logic, and/or a reduction in traffic (e.g., traffic across a bus or interface, etc.). For instance, approaches herein can employ a series of relatively small buses and/or relatively small arbitrators, unlike some other approaches which employ large buses such as a large individual control bus. Additionally, unlike previous approaches, embodiments herein may permit flexible compression for different targets (e.g., different degrees of compression for targets with different quantities of parallel target data streams) and/or permit enhanced arbitration (e.g., limit a quantity of simultaneous transaction requests that are conveyed to a target, reduce a quantity/size of circuitry (e.g., a FIFO) associated with a target, and/or enforce differing degrees of priority (e.g., a regular priority, a high priority/ low priority and/or guaranteed priority, etc.)), as described herein. In view of the above, embodiments described herein employing initiator identifier compression can reduce computing resource overhead (e.g., power, time, etc.) and can therefore yield enhanced overall performance of a computing system in which such methodologies are employed.

In the interest of clarity, embodiments herein will be generally described in relation to initiator identifier compression in a tiered interconnection structure having a given quantity of tiers (e.g., two tiers), a given quantity of initiators (e.g., 21 initiators, a given quantity of targets (e.g., one target), and a given quantity of initiator groups (e.g., three initiator groups). However, it will be appreciated that embodiments in which a different quantity of tiers, a quantity of initiators, a quantity of targets, and/or a quantity of initiator groups are contemplated within the scope of the disclosure. In the interest of clarity, embodiments herein will be generally described in relation to a target that is a memory resource, however, it will be appreciated that embodiments in which a cache, a processing/co-processing resource, an accelerator such as a multi-core central-processing unit (CPU), a graphical processing unit (GPU), a visual processing unit (VPU), a field-programmable gate array (FPGA), an application-specific circuit (ASIC), an input port of another interconnection structure, or any combination thereof, among other types of chips and/or devices which may be the target are contemplated within the scope of the disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the computing system 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include initiator identifier compression circuitry 113. Although not shown in FIG. 1 so as to not obfuscate the drawings, the initiator identifier compression circuitry 113 can include various circuitry to facilitate aspects of the disclosure described herein. In some embodiments, the initiator identifier compression circuitry 113 can include special purpose circuitry in the form of an ASIC, FPGA, state machine, hardware processing device, and/or other logic circuitry that can allow the initiator identifier compression circuitry 113 to orchestrate and/or perform operations (associate respective IID of a sub-set of initiators coupled via an interconnection structure to a target with respective parallel target data streams) in accordance with the disclosure.

In some embodiments, the memory sub-system controller 115 includes at least a portion of the initiator identifier compression circuitry 113. For example, the memory sub-system controller 115 can include a processor 117 (processing device) configured to execute instructions stored in local memory 119 for performing the operations described herein. In some embodiments, the initiator identifier compression circuitry 113 is part of the memory sub-system 110, an application, or an operating system. The initiator identifier compression circuitry 113 can be resident on the memory sub-system 110 and/or the memory sub-system controller 115. As used herein, the term "resident on" refers to something that is physically located on a particular component. For example, the initiator identifier compression circuitry 113 being "resident on" the memory sub-system 110, for example, refers to a condition in which the hardware circuitry that comprises the initiator identifier compression circuitry 113 is physically located on the memory sub-system 110. The term "resident on" may be used interchangeably with other terms such as "deployed on" or "located on," herein.

The example system 110, which can be referred to in the alternative as an "apparatus," includes a memory sub-system controller 115 and initiator identifier compression circuitry 113 (referred to in the alternative as "initiator identifier compression circuitry" 113). In a non-limiting example, an apparatus (e.g., the memory sub-system 110) includes a memory resource 116 and a processing device (e.g., the initiator identifier compression circuitry 113). The apparatus can be a system-on-chip, although embodiments are not so limited.

Figure 2A:
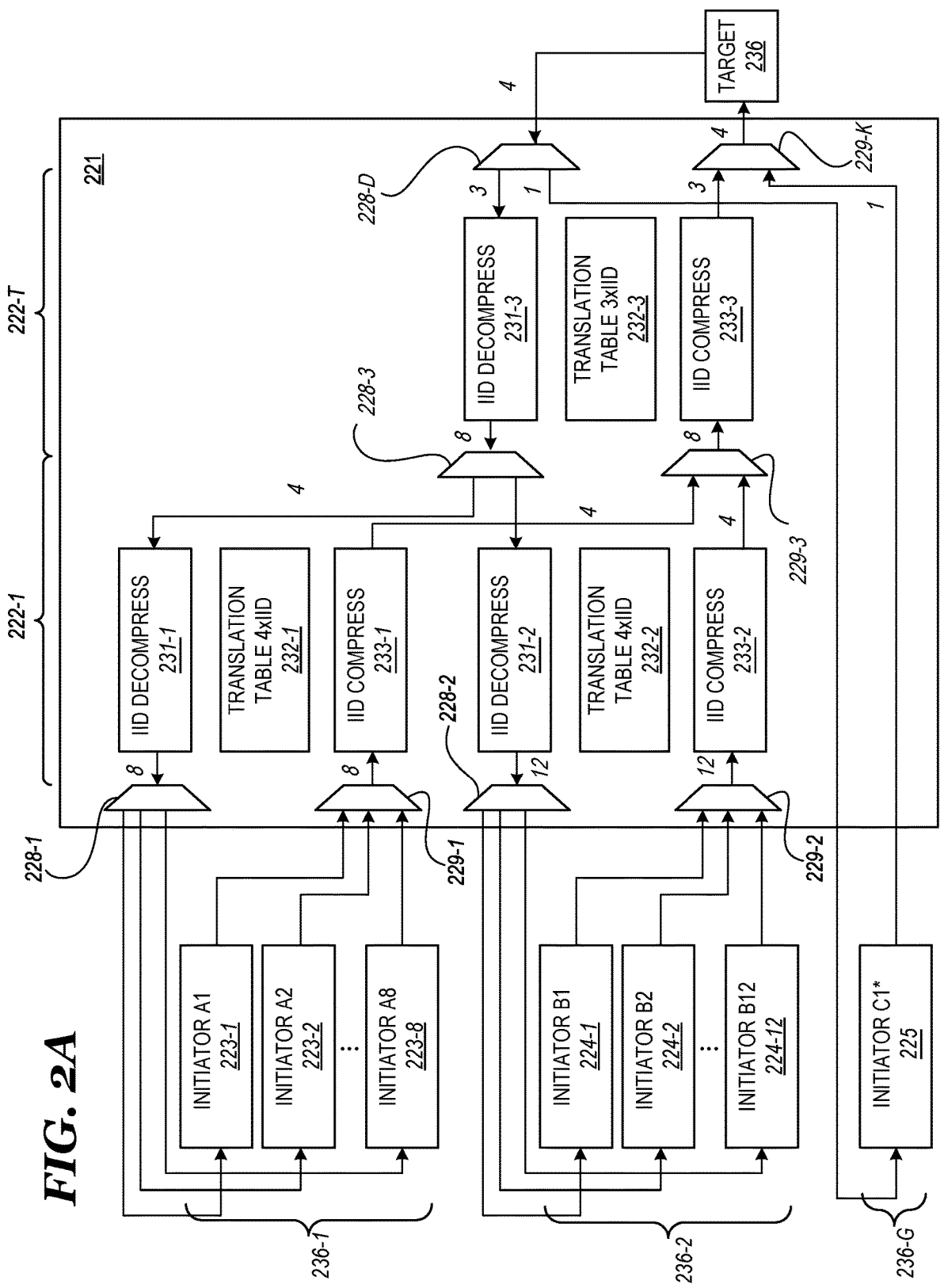
FIG. 2A illustrates an example of a series of operations that can be performed utilizing an example of an interconnection structure in accordance with some embodiments of the present disclosure.
Figure 2B:
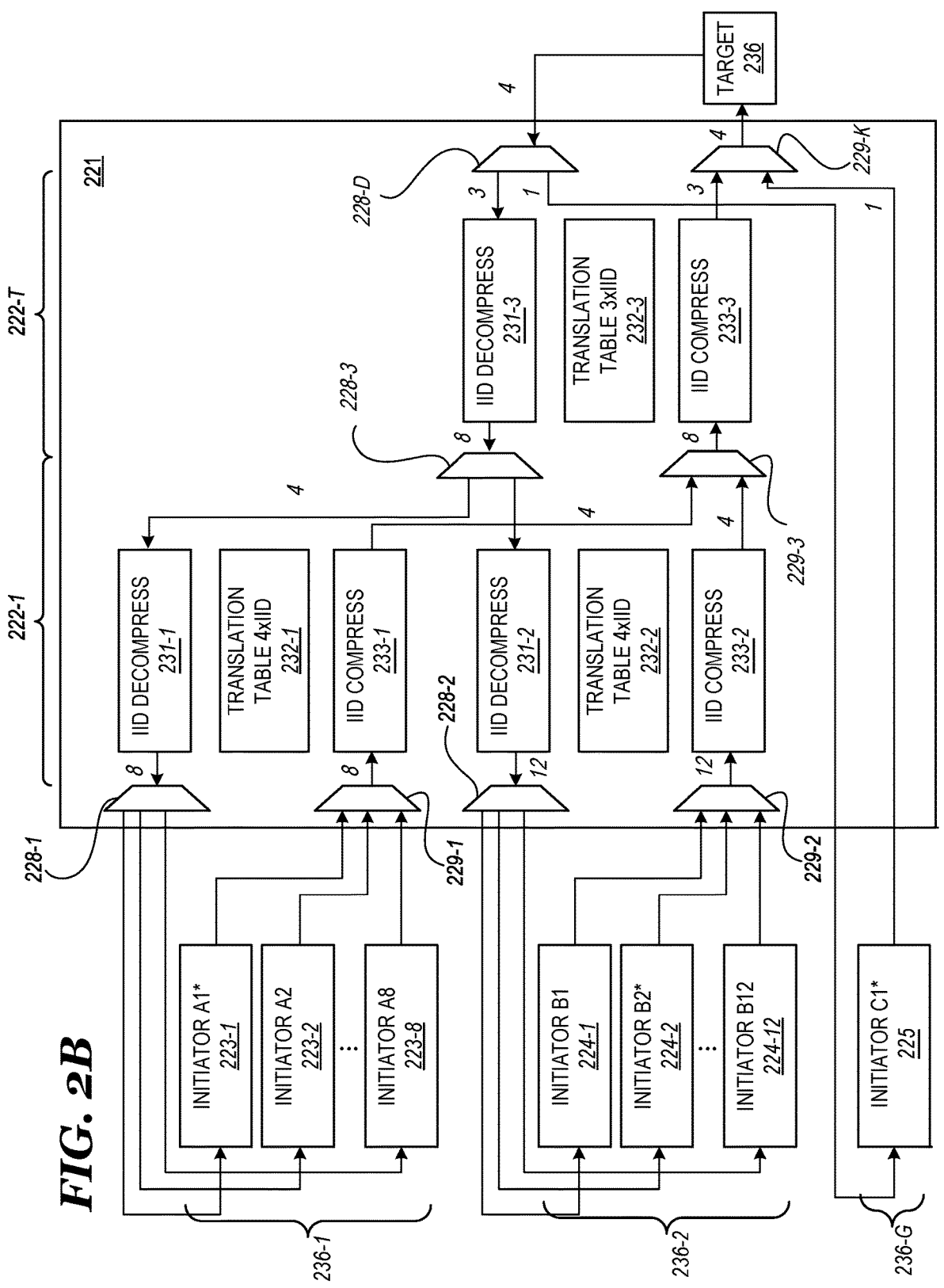
FIG. 2B illustrates another example of a series of operations that can be performed utilizing an example of an interconnection structure in accordance with some embodiments of the present disclosure.

In some embodiments, the initiator identifier compression circuitry 113 can be configured to associate respective identifiers (IID) with the parallel target data streams by storing the respective IID in a translation table or other type of data structure, as described in greater detail herein with respect to FIG. 2A and FIG. 2B. As used herein, a "data structure" such as a translation table refers to a specialized format for organizing and/or storing data, which may or may not be organized in rows and columns. Examples of data structures include arrays, files, records, tables, trees, linked lists, hash tables, etc. In some embodiments, the data structure can be configured to store a logical-to-physical (L2P) mapping table, although embodiments are not limited to this particular example. The initiator identifier compression circuitry 113 can include or be coupled to at least one translation table with a quantity of outputs (e.g., a quantity of IID) that is less than a quantity of initiators, as detailed herein. Thus, approaches herein can employ fewer and/or smaller components (e.g., buses and/or interfaces with smaller widths) than other approaches such as the previous approaches described herein. As such, embodiments herein can realize a reduction in power consumption and/or an improvement in performance as compared to other approaches such as those that do not employ initiator identification compression.

Figure 4:
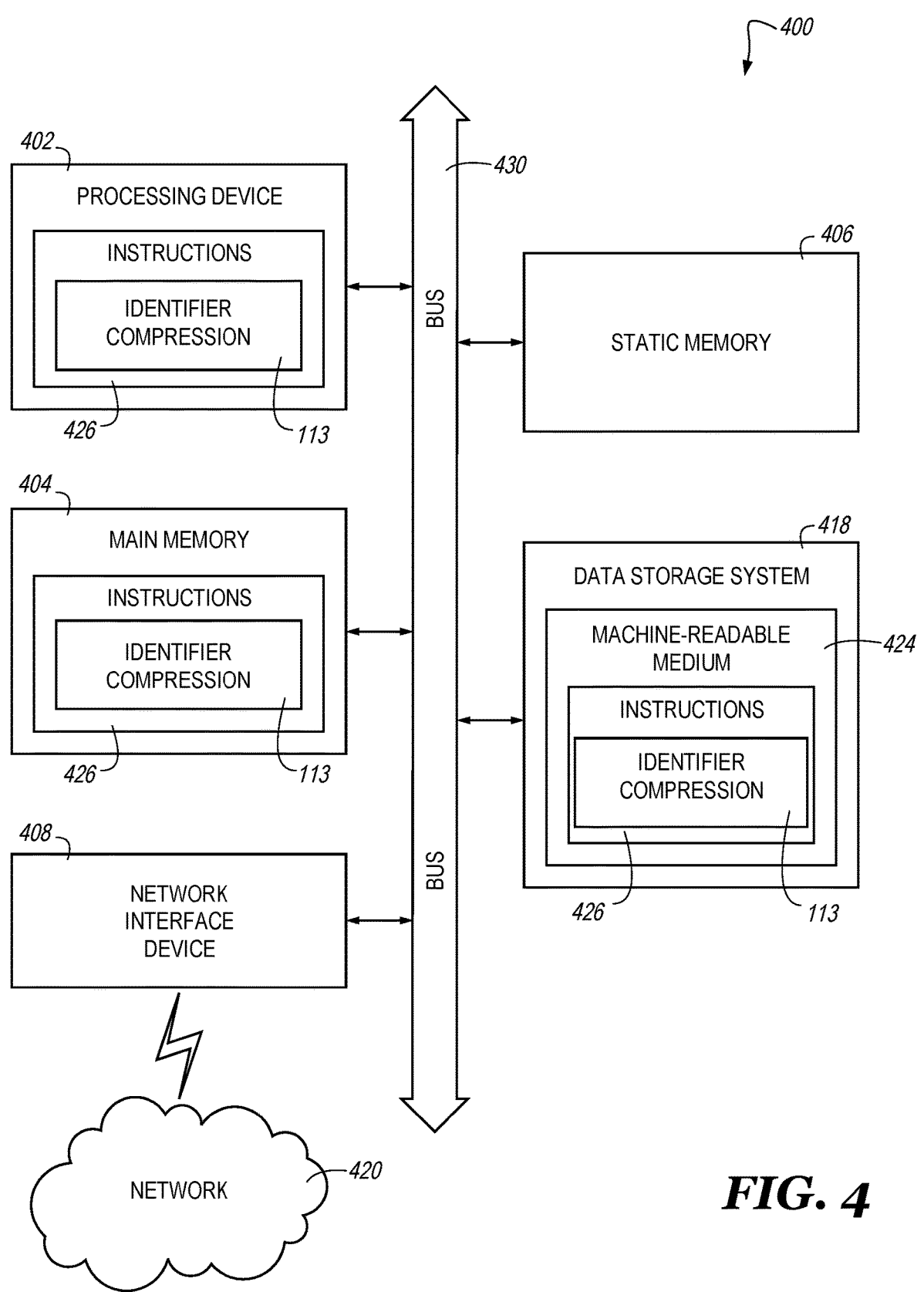
FIG. 4 is a block diagram of an example computer system in which embodiments of the present disclosure may operate.

In a non-limiting example, a non-transitory computer-readable storage medium (e.g., the machine-readable storage medium 424 illustrated in FIG. 4, herein) comprises instructions (e.g., the instructions 426 illustrated in FIG. 4, herein) that, when executed by a processing device (e.g., the initiator identification compression circuitry 113 and/or the processing device 402 illustrated in FIG. 4, herein), cause the processing device to associate respective IIDs of a sub-set of initiators coupled via an interconnection structure to a target with respective parallel target data streams and perform, via an individual target data stream of the target data streams, an operation associated with the target and an individual initiator included in the sub-set of initiators, as described herein. For instance, in some embodiments, the instructions can be further executed by the processing device to cause the target to receive a command to locate a particular data entry that has been written to the target. In some embodiments, the instructions can be further executed by the processing device to cause the target to write a particular data entry to the target.

FIGS. 2A-2B illustrate an example of a series of operations that can be performed utilizing an example of an interconnection structure in accordance with some embodiments of the present disclosure. As used herein, the interconnection structure 221 refers to hardware or a combination of hardware and logic that interconnects various components (e.g., processor cores, memory devices, etc.). Examples of interconnection structures include various distributed fabric and/or virtualized fabrics such as a distributed (Software for Open Networking in the Cloud) SONIC fabric, among other types of fabrics. In some embodiments, the interconnection structure 221 can be employed in a system on a chip (SOC) or network on chip (NOC) configuration, among other possibilities.

The interconnection structure 221 can couple initiators to a target (e.g., a target shared by each of the initiators). In some embodiments, the initiators can be controllers, a peripheral device/I/O device (e.g., a peripheral device employing direct memory access (DMA), and/or processing devices (e.g., CPU, GPU, VPU, FPGA, and/or an ASIC, among other types of processing devices). For instance, each of the initiators can be a different respective controller(s) (e.g., memory controllers) and/or different respective processing devices. In some embodiments, the target can be a memory device such as a volatile memory device and/or a non-volatile memory device. However, as mentioned other types of targets such as a cache, a processing/co-processing resource, an accelerator such as a multi-core CPU, a GPU, a VPU, a FPGA, an ASIC, an input port of another interconnection structure, or any combination thereof, among other types of chips and/or devices are possible.

In some embodiments, the interconnection structure 221 can be a tiered interconnection structure that includes a plurality of tiers. For instance, as illustrated in FIG. 2A and FIG. 2B, the interconnection structure 221 can be a tiered interconnection structure including a first IID tier 222-1 and a second IID tier 222-T (collectively referred to herein as IID tiers 222). While illustrated as including two respective tiers in FIG. 2A and FIG. 2B, embodiments with fewer or additional tiers are possible. For instance, in some embodiments the initiators may be coupled via one tier or may be directly coupled to the target.

The tiers or IID tiers can include or permit different respective quantities of IID, as detailed herein. For instance, taken from the perspective of the initiators the tiers may generally include progressively fewer IID than a quantity of IIDs associated with the initiators. Thus, employing a tiered interconnection structure can promote various aspects herein such as IID compression and/or IID decompression, as described herein.

An IID compression component and a corresponding IID decompression component can be located between the IID tiers 222 of the interconnection structure 221 and can be located between an IID tier and the target and/or initiators, as described herein. As used herein, an IID compression component refers to a bus, a multiplexor, logic, a memory device, and/or other circuitry configured to reduce a quantity of IID. In some embodiments, the IID decompression component can include logic and/or a memory device that is configured to translate (e.g., compress) a given IID to a different IID, as described herein.

As used herein, an IID decompression component refers to a bus, a multiplexor, logic, a memory device, and/or other circuitry configured to increase a quantity of IID. In some embodiments, the IID decompression component can include logic and/or a memory device that is configured to translate (e.g., decompress) a given IID to a different IID, as described herein. For instance, from the perspective of the target, an IID decompression component can increase a first quantity of IID entering the IID decompression component to a second quantity of IID exiting the IID decompression component that is greater than the first quantity of IID entering the IID decompression component.

As illustrated in FIG. 2A and FIG. 2B the IID tiers can include a set of arbiters associated with sides of the IID tier. For instance, a first arbiter 229-1 and a first corresponding arbiter 228-1 along with a second arbiter 229-2 and a second corresponding arbiter 228-2 may be located between the first IID tier 222-1 and the initiators. A third arbiter 229-3 and a third corresponding arbiter 228-3 may be located between the first IID tier 222-1 and the second IID tier 222-2. Similarly, the fourth arbiter 229-K and a fourth corresponding arbiter 228-D may be located between the second IID tier 222-2 and the target 236, FIG. 2A and FIG. 2B. In this way, the each IID tier can be configured with arbiter to facilitate performance of initiator identifier compression on transaction requests sent from initiators to a target and facilitate performance of initiator identifier compression on responses (responsive to the transaction requests) that are sent back from target to the initiators associated with the IID transaction requests.

For instance, each IID compression component and a corresponding IID decompression component can be associated with a corresponding translation table. As used herein, a translation table refers to a look-up table or other data structure that is configured to translate a quantity of IID into a different quantity of IID. For instance, the translation table can include information (e.g., IIDs) that can be utilized by an initiator identifier compression circuitry 113 and/or controller to compress and/or decompress a quantity of IID.

For example, in the non-limiting examples illustrated in FIG. 2A and FIG. 2B, a first IID decompression component 231-1 and the first IID compression component 233-1 can be coupled to a first translation table 232-1. The second IID decompression component 231-2 and the second IID compression component 233-2 can be coupled to the second translation table 232-2. The third IID compression component 233-3 can be coupled to a third translation table 232-3. That is, all illustrated in FIG. 2A and FIG. 2B, pairs of the IID decompression components (e.g., the first IID decompression component 231-1 and the IID compression components (e.g., the first IID compression component 233-1) can have access to the same translation table (e.g., the first translation table 232-1) to permit IID compression and decompression as described herein.

Table 1 illustrates an example of the information included in the first translation table

TABLE 1

| Uncompressed (Original) IID | Corresponding IID (Tier 1 compressed IID) | Priority |
|---|---|---|
| A8 | X1 | regular |
| A6 | X2 | regular |
| A2 | X3 | regular |
| A1 * | X4 * | guaranteed |

As shown in Table 1, a total quantity (e.g., eight) of initiators (e.g., with corresponding IID A1-A8) in the first initiator sub-group 236-1 can be compressed to a sub-set of initiators (e.g., IID A8, A6, A2, and A1) to a quantity (e.g., four) of IID that is less than the total quantity of initiators in the first initiator sub-group 236-1. Such compression can be performed based on the priority of the given initiators and/or based on various types of arbitration mechanisms (e.g., round robin arbitration, etc.). For instance, as illustrated in the Tables 1-3, in some embodiments the priority information associated with a given IID can be carried through the interconnection structure such that the priority remains the same before and after at least one sequence of compression/decompression. Both the uncompressed IID (A1), the compressed IID (X4), and the final compressed IID (Y1) may each have a guaranteed priority. However, in some embodiments the priority of an IID can be altered after at least one sequence of compression/decompression. For instance, the uncompressed IID (B2) and the compressed IID (X5) can each have a guaranteed priority. However, at the second tier X5 may undergo compression to a final compressed IID (Y2) that is reassigned a different priority such as a regular priority and therefore the final compressed IID (Y2) may subsequently undergo arbitration with a regular priority rather than a guaranteed priority when attempting to post a transaction to the target. As used herein, a compressed IID refers to an IID that has undergone at least one sequence of IID compression. As used herein, a final compressed IID refers to an IID that has undergone a quantity of compression sequences equal to a total quantity of tiers in an interconnection fabric.

The sub-set of initiators (e.g., IDD A8, A6, A2, and A1) can subsequently be translated (e.g., (as represented by element 233-1) using the information in the first translation table 232-1 to a corresponding sub-subset of initiators (e.g., translated IID represented in Table 1 as "tier 1 compressed IID"). For instance, IID A8 can be translated to IID X1, IID A6 can be translated to IID X2, IID A2 can be translated to IID X3, and IID A1 can be translated to IID X4. That is, the above IID (e.g., A8, A2, A2, and A1) can have higher priorities than other initiators within the first initiator sub-group 236-1 and hence can be included in the sub-set of corresponding IID as illustrated in Table 1 and/or may be selected via various probabilistic or other types of arbitration mechanism. For instance, when each of the IID within the first initiator sub-group 236-1 have the same priority (e.g., a regular priority) then the probability of any one of the IID of the first initiator sub-group 236-1 being selected can be represented as $3/2/8=0.1875$; where "3" is the number of slots (e.g., compression slots) available in the third IID compression component 233-3, where "2" is equal to a total quantity of initiator sub-groups having respective arbiters associated therewith (other than 236-G which has only one initiator with a guaranteed priority), and where "8" is equal to a total quantity of initiators included in the particular initiator sub-group.

Table 2 illustrates an example of the information included in the second translation table 232-2. As shown in Table 2, a total quantity (e.g., twelve) of initiators (e.g., with corresponding IID B1-B12) in the second initiator sub-group 236-2 can be compressed to a sub-set of initiators (e.g., having IID B2, B4, B11, and B12) to a quantity (e.g., four) of IID that is less than the total quantity of initiators in the second initiator sub-group 236-2. The sub-set of initiators can subsequently be translated (e.g., as represented by element 233-2) to a corresponding sub-subset of initiators (e.g., translated IID represented in Table 2 as "tier 1 compressed IID"). For instance, IID B2 can be translated to IID X5, IID B4 can be translated to IID X6, IID B11 can be translated to IID X7, and IID B12 can be translated to IID X8. That is, the above IID (e.g., B2, B4, B11, and B12) can have higher priorities than other initiators within the second initiator sub-group 236-2 and hence can be included in the sub-set of corresponding IID as illustrated in Table 2 and/or may be selected via various probabilistic or other types of arbitration mechanism. For instance, when each of the IID within the second initiator sub-group 236-2 have the same priority (e.g., a regular priority) then the probability of any one of the IID of the second initiator sub-group 236-2 being selected can be represented as Mar. 2, 2012-0.125; where "3" is the number of slots (e.g., compression slots) available in the third IID compression component 233-3, where "2" is equal to a total quantity of initiator sub-groups (other than 236-G which has only one initiator with a guaranteed priority), and where "12" is equal to a total quantity of initiators included in the particular initiator sub-group. That is, the probability of a given initiator in the second initiator sub-group 236-2 being selected may be lower than the probability of a given initiator in the first second initiator sub-group 236-1 due at least to having more (e.g., 12) initiators in the second initiator sub-group 236-2 than the initiators (e.g., 8) in the first initiator sub-group 236-1 even though in the above example the priorities of the second initiator sub-group 236-2 and the first initiator sub-group 236-1 are the same.

TABLE 2

| Uncompressed (Original) IID | Corresponding IID (Tier 1 compressed IID) | Priority |
|---|---|---|
| B2 * | X5 * | guaranteed |
| B4 | X6 | regular |
| B11 | X7 | regular |
| B12 | X8 | regular |

As illustrated in FIG. 2A and FIG. 2B, the quantity (e.g., four) of IID of the Tier 1 IID in the first translation table 232-1 can be equal to the quantity (e.g., four) of the IID of the Tier 1 IID in the second translation table 232-2. Having the quantity of Tier 1 IID from different translation tables be the same can promote aspects herein such as equitable arbitration of transaction requests from the initiators. However, the quantity IID that undergo compression at a given IID compression component and/or using a given translation table etc. can be varied to adjust arbitration fairness (a likelihood of an IID from a given initiator and/or initiator sub-group may be permitted to post a transaction to a target).

Table 3 illustrates an example of the information included in the third translation table 232-3. As shown in Table 3, a total quantity (e.g., eight) of initiators (e.g., with corresponding IID X1-X8) can be further compressed in the second tier 222-T to a sub-set of initiators (e.g., having IID X4, X1, X7) to a quantity (e.g., three). The sub-set of initiators in the second tier 222-T can subsequently be translated (e.g., as represented by element 233-3) to a corresponding sub-subset of initiators. For instance, IID X4 can be translated to IID Y1, IID X1 can be translated to IID Y2, IID X7 can be translated to IID Y3.

TABLE 3

| Compressed IID | Final compressed IID (e.g., final corresponding IID) | Priority |
|---|---|---|
| X4 * | Y1 * | guaranteed |
| X5 * | Y2 | regular |
| X7 | Y3 | regular |

US 12,615,061 B2

15 16

In some embodiments, the corresponding quantity of IID (final compressed IID) can be less than an initial quantity of IID. For instance, in some embodiments the corresponding quantity of IID (final compressed IID) in the second tier 222-T can be less than or equal to the quantity of target data stream of the target 236. For instance, continuing with the non-limiting example above, the quantity of final compressed IID (Y1, Y2, Y3) can be equal to three final compressed IID whereas the quantity of target data stream is equal to four. In some embodiments, at least some of X4, X5, and X7 can have higher priorities (e.g., a guaranteed priority) than other IID compressed IID (e.g., X1, X2, X3, X6, and X8) which are not selected for further IID compression. Though in some embodiments, each of X1-X8 can have the same priority and in such embodiments X4, X5, and X7 may be selected based on various arbitration mechanisms.

Thus, the quantity of final compressed IID (Y1, Y2, Y3) along with the IID C1 from the initiator 225 having the guaranteed priority (as represented by the "*") can each be assigned to at last one individual target data stream of a quantity (e.g., four) target data stream of the target 236. That is, each of the corresponding IID and transaction requests from the initiators (e.g., those having the IID Y1, Y2, Y3, and C1) can be permitted to post a transaction to the target 236 at a given time. In some instances, initiator 225 can be guaranteed to post a transaction action to the target via an individual parallel target data stream. Though, in some embodiments such as when the initiator 225 is requesting a plurality of transactions the initiator 225 can be associated with a plurality of parallel target data streams or even each of the parallel target data streams.

While discussed above with respect to compression of the IID, the translation tables can be employed to decompress IID. For instance, responsive to posting a transaction to the target 236 each of the initiators (e.g., those having the IID Y1, Y2, Y3) can undergo decompression (e.g., as represented by elements 231-1, 231-2, and 231-3), via the decompression components and transaction tables, such that the responses to the transaction requests are provided to the particular requestors. For instance, with regard to IID Y1, the decompression components can perform an inverse translation to translate the IID Y1 to X4 using the third translation table 232-3, and translate X4 to A1 using the first translation table 232-1, such that the response (e.g., information associated with a read/write operation) etc. is provided to the particular initiator (e.g., initiator 223-1) that initially sent the particular transaction request. That is, the initiators that are compressed (e.g., to the tier 2 compressed IID) may then be permitted to post a transaction (e.g., having a tier 2 compressed IID) to the target. After posting a transaction, the compressed IID (e.g., tier 2 compressed IID) can subsequently undergo decompression in one or more steps (e.g., via one or more decompression components), as described herein, such that the original IID and an associated response is provided to the original requesting initiator. In addition, a response (e.g., information associated with a read/write operation) etc. can be provided to the particular initiator (e.g., initiator 225) that is an individual initiator included in a given initiator sub-group such as the third initiator sub-group 236-G without any inverse translation as the IID (C1) of in the individual initiator that did not undergo translation.

In some embodiments, taken from the perspective of the initiators the first IID tier 222-1 can compress a first quantity of IID (e.g., 21 IID) associated with each of the initiators to a second quantity of IID (e.g., 9 IID) that is less than the initial quantity of IID. Similarly, taken from the perspective of the initiators, the second IID tier 222-T can further compress the second quantity of initiators (e.g., 9 IID) that is third quantity of IID (e.g., 4 IID) that is less than the second quantity of IID.

In some embodiments, the first quantity of IID in the first tier (or another tier that is most proximate to the initiators) can include a quantity of IID that is equal to a quantity of IID of each of the initiators. In some embodiments, the third quantity of IID in the third tier (or another tier that is most proximate to the target) can be equal to a fixed quantity of parallel target data streams of the target. As such, approaches herein can reduce a quantity of IID that are transmitted across the entire interconnection structure and therefore realize a reduction in a quantity and/or size of physical connections, a reduction in computational power, a reduction in traffic (e.g., traffic across a bus), a reduction in an amount of logic, and/or a reduction in power consumed by components in an interconnection structure, as compared to other approaches that do not employ initiator identifier compression.

The interconnection structure 221 can couple a target 236 to a plurality of initiators. For instance, a plurality of initiators can be coupled to a target or a plurality of targets. The initiators can be grouped into initiator sub-groups. For instance, the interconnection structure 221 can couple an individual target such the target 236 to a plurality of initiator sub-groups including a first initiator sub-group 226-1, a second initiator sub-group 226-2, and a third initiator sub-group 226-G. Each initiator sub-group can include one or more initiators.

In some embodiments, at least some of the initiator sub-groups can include different quantities of initiators. In some embodiments, each of the initiator sub-groups can include different quantities of initiators, among other possibilities. For example, the first initiator sub-group 226-1 can include a plurality of initiators 223-1, 223-2, . . . 223-8, the second initiator sub-group 226-2 can include a plurality of initiators 224-1, 224-2, . . . 224-12, and the third initiator sub-group 226-G can include an individual initiator 225, illustrated in FIG. 2A and FIG. 2B. That is, the first initiator sub-group 226-1 can include a total of eight initiators (e.g., initiator 223-1, 223-2, . . . 223-8), the second initiator sub-group 226-2 can include a total of 12 initiators (e.g., initiator 224-1, 224-2, . . . 224-12), and the third initiator group 226-G can include an individual initiator (e.g., initiator 225). Having different quantities of initiators in different sub-groups of initiators and/or different quantities of sub-groups can ease and/or expedite arbitration of transaction requests, etc.

In some embodiments, initiator sub-groups and/or different initiators within a given initiator sub-group can have different priorities, different latency requirements, different throughput requirements, etc. . . . A priority associated with a given initiator in a given initiator sub-group can impact the likelihood of the given initiator to be permitted to post a transaction to a target data stream of a target, as described herein in greater detail with respect to FIG. 2B. Similarly, a priority associated with a given initiator sub-group can impact the likelihood of a given initiator included in the initiator sub-group to be permitted to post a transaction to a target data stream of a target.

For instance, an initiator sub-group with an elevated (e.g., higher priority than a regular priority or low priority) may have an increased (or in some instances a guaranteed) likelihood of posting a transaction to a target data stream of a target than an initiator sub-group with a lower priority associated therewith. For instance, the first initiator sub-group 226-1 and/or an initiator included in the first initiator group 226-1 can have a first priority (e.g., a high priority) associated therewith, the second initiator sub-group 226-2 and/or an initiator included in the second initiator group can have a second priority (e.g., a low priority, a regular priority, etc.) associated therewith that is different than the first priority, and the third initiator sub-group 226-G can have a third priority (e.g., a guaranteed priority) associated therewith that is different than the second priority and the first priority). That is, the initiator sub-groups can have different respective priorities and/or initiators within a given sub-group can have different respective priorities. For instance, as described herein with respect to Tables 1-3 at least some of the initiators can have different priorities. The priorities of the initiator sub-groups and/or priorities of initiators within a given initiator sub-group can be stored in a look-up table or otherwise stored in a manner accessible by a controller, among other possibilities. Having different priorities for different initiator sub-groups and/or different initiators within a given initiator sub-group can ease and/or expedite arbitration of transaction requests, etc. For instance, initiators and/or IID for specific transactions requests from an initiator can have higher priority or guaranteed priority and therefore have an increased (or in some instances a guaranteed) likelihood of posting a transaction to a target data stream of a target than other initiators and/or IID for specific transaction requests with regular priorities and/or low priorities.

Determination of and/or assignment of a priority to an initiator and/or a particular transaction request from the initiator, compression/decompression, as well as other operations such as those described in connection with FIGS. 2A-2B can be controlled by a processing device (e.g., the initiator identifier compression circuitry 113 illustrated in FIG. 1, herein and/or the processor 117 illustrated in FIG. 1, herein). Embodiments in which initiators in a given initiator sub-group have different respective priorities can ensure that system critical and/or other high priority transaction requests are timely processed by a target and/or otherwise case and/or expedite arbitration of initiator transaction requests.

In the non-limiting example illustrated in FIG. 2B, a first initiator (Initiator A1) 223-1 included in the first initiator sub-group 236-1 can have a first priority (e.g., a guaranteed priority as indicated by "*" in FIG. 2B) while each of the other initiators in the first initiator sub-group 236-1 can have a different priority (e.g., a non-guaranteed priority). Similarly, a second initiator (Initiator B2) 224-2 can have a first priority (e.g., a guaranteed priority as indicated by "*" in FIG. 2B) while each of the other initiators in the second initiator sub-group 236-2 can have a different priority (e.g., a non-guaranteed priority). As mentioned, the initiator 225 in the third initiator sub-group 236-G can have a guaranteed priority (e.g., as indicated by "*" in FIG. 2B). As used herein, a guaranteed priority ensures that the particular initiator with the guaranteed priority is selected to post a transaction to a respective individual target data stream of the target 236. Conversely, an initiator with a non-guaranteed priority is not guaranteed to post a transaction to a target and must undergo arbitration (e.g., round robin arbitration) prior to potentially being selected to post a transaction to the target.

For instance, continuing with the above description of FIG. 2B, each of the first initiator (Initiator A1) 223-1 in the first initiator sub-group 236-1, the second initiator (Initiator B2) 224-2 in the second initiator sub-group 236-2, and the initiator 225 in the third initiator sub-group 236-G can be guaranteed to post a transaction to a respective individual target data stream of the target 236. For example, the first initiator (Initiator A1) 223-1 can transmit a transaction request that is received at the first compression component 233-1 in the first IID tier 222-1 and subsequently undergoes compression along with other transaction requests from initiators included in the first initiator sub-group 236-1 to form a compressed quantity of transaction requests (e.g., 4 transaction requests with 4 corresponding IID) that includes the transaction request of the first initiator 223-1.

The compressed quantity of transaction requests can be transmitted to the third corresponding arbiter 229-3 in the second IID tier 222-T at which the compressed quantity of transaction requests and another compressed quantity of transaction requests (e.g., from the second initiator sub-group 236-2) can be further compressed to a threshold quantity of initiators (and corresponding IID). That threshold quantity of transaction requests can be equal to a fixed quantity of parallel target data streams of the target 236 less any other guaranteed transaction requests. For instance, as illustrated in FIG. 2B, the threshold quantity of transaction requests can be equal to three transaction requests. Thus, the sum of the threshold quantity of transaction requests (e.g., three transaction requests) and the other guaranteed transaction requests (e.g., one guaranteed transaction requests corresponding to the initiator 225) may equal to the fixed quantity of parallel target data streams (e.g., being configured to process four transaction requests at the same time) of the target 236. As such, approaches herein can guarantee that at least some initiators (e.g., those associated with system critical and/or other high priority transaction requests) are timely processed by a target and/or otherwise ease and/or expediate arbitration of initiator transaction requests based upon a fixed quantity of parallel target data streams of a target.

FIG. 2B illustrates another example of a series of operations that can be performed utilizing an example of an interconnection structure in accordance with some embodiments of the present disclosure. The elements (e.g., initiators, target, and interconnection structure, etc.) in FIG. 2B can be analogous to the elements of FIG. 2A, with the distinction that at least some of the initiators in the initiator sub-groups in FIG. 2B have different respective priorities than other initiators in the initiator sub-groups in FIG. 2B.

Determination of and/or assignment of a priority to an initiator and/or a particular transaction request from the initiator, compression/decompression, as well as other operations such as those described in connection with FIGS. 2A-2B) can be controlled by a processing device (e.g., the initiator identifier compression circuitry 113 illustrated in FIG. 1, herein and/or the processor 117 illustrated in FIG. 1, herein). Embodiments in which initiators in a given initiator sub-group have different respective priorities can ensure that system critical and/or other high priority transaction requests are timely processed by a target and/or otherwise case and/or expedite arbitration of initiator transaction requests.

In the non-limiting example illustrated in FIG. 2B, a first initiator (Initiator A1) 223-1 included in the first initiator sub-group 236-1 can have a first priority (e.g., as indicated by "*" in FIG. 2B) while each of the other initiators in the first initiator sub-group 236-1 can have a different priority (e.g., a non-guaranteed priority). Similarly, a second initiator (Initiator B2) 224-2 can have a first priority (e.g., as indicated by "*" in FIG. 2B) while each of the other initiators in the second initiator sub-group 236-2 can have a different priority (e.g., a non-guaranteed priority). As mentioned, the initiator 225 in the third initiator sub-group 236-2 can have a guaranteed priority (e.g., as indicated by "*" in FIG. 2B). As used herein, a guaranteed priority ensures that the particular initiator with the guaranteed priority is selected to post a transaction to a respective individual target data stream of the target. Conversely, an initiator with a non-guaranteed priority is not guaranteed to post a transaction to a target and must undergo arbitration (e.g., round robin arbitration) prior to potentially being selected to post a transaction to the target.

For instance, continuing with the above description of FIG. 2B, each of the first initiator (Initiator A1) 223-1 in the first initiator sub-group 236-1, the second initiator (Initiator B2) 224-2 in the second initiator sub-group 236-2, and the initiator 225 in the third initiator sub-group 236-G can be guaranteed to post a transaction to a respective individual target data stream of the target 236. For example, the first initiator (Initiator A1) 223-1 can transmit a transaction request that is received at the first corresponding arbiter 229-1 and the first IID compression component 233-1 in the first IID tier 222-1 and subsequently undergoes compression along with other transaction requests from initiators included in the first initiator sub-group 236-1 to form a compressed quantity of transaction requests (e.g., four transaction requests with four corresponding IID) that includes the transaction request of the first initiator 223-1.

The compressed quantity of transaction requests can be transmitted to the third corresponding arbiter 229-3 and the third IID compression component 233-3 in the second IID tier 222-T at which the compressed quantity of transaction requests and another compressed quantity of transaction requests (e.g., from the second initiator sub-group 236-2) can be further compressed to a threshold quantity of initiators (and corresponding IID). That threshold quantity of transaction requests can be equal to a fixed quantity of parallel target data streams of the target 236 less any other guaranteed transaction requests. For instance, as illustrated in FIG. 2B, the threshold quantity of transaction requests can be equal to three transaction requests. Thus, the sum of the threshold quantity of transaction requests (e.g., three transaction requests) and the other guaranteed transaction requests (e.g., one guaranteed transaction requests corresponding to the initiator 225) may equal to the fixed quantity of parallel target data streams of the target 236. As such, approaches herein can guarantee that at least some initiators (e.g., those associated with system critical and/or other high priority transaction requests) are timely processed by a target and/or otherwise ease and/or expedite arbitration of initiator transaction requests based upon a fixed quantity of parallel target data streams of a target. While FIG. 2A and FIG. 2B illustrate particular quantities of groups, initiator quantity of initiators in the initiator groups, and/or a quantity of tiers, the quantity of groups, quantity of initiators in a groups, and/or a quantity of tiers can be varied.

FIG. 3 is a flow diagram corresponding to a method 350 for initiator identifier compression in accordance with some embodiments of the present disclosure. The method 350 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 350 is performed by the initiator identifier compression circuitry 113 of FIG. 1 and/or the identifier compression 113 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 352, the method 350 includes association of respective initiator identifiers (IID) of a sub-set of initiators coupled via an interconnection structure to a target with respective parallel target data streams, as described herein. For instance, a quantity of initiators coupled via an interconnection structure to a target with respective parallel target data streams may submit a quantity of transaction requests involving the target that exceeds a quantity of the respective parallel data streams of the target. Thus, the quantity of transaction requests and corresponding IID can be compressed (reduced) to a sub-set (compressed quantity) of transactions and corresponding sub-set (compressed quantity).

In some embodiments, the quantity of respective identifiers of the sub-set of initiators is less than a total quantity of respective identifiers. For instance, in some embodiments, the quantity of respective identifiers of the sub-set of initiators is less than or equal to a quantity of the parallel target data streams. For instance, in some embodiments the compressed quantity of transactions can be equal to a quantity of the respective parallel data streams of the target. Stated differently, the quantity of initiators in a sub-set of initiators can be equal to quantity of the respective parallel data streams of the target. Thus, the quantity of transactions requests which are processed by the target at a given time can be maximized without having any additional transactions requests (and corresponding IID) be transmitted across the interconnection structure to the target that would result in unnecessary traffic across the interconnection structure (e.g., may not be processed by the target at the given time).

At 354, the method 350 includes performance of an operation associated with the target and an individual initiator included in the sub-set of initiators. For instance, the operation can be performed via an individual target data stream of the target data streams. For example, continuing with the embodiments described in FIG. 2A and FIG. 2B, the operation can be performed via one or more of the four individual target data streams. Examples of different types of operations include read operations, write operations, erase operations, cache-write back operations, I/O requests such as those communicated to an entry port in another interconnection structure (e.g., an entry port in another fabric), among other possible types of operations. The type of operation performed can be based upon a type of transaction request submitted by an initiator.

For instance, an initiator may transmit a given type of transaction request such as a read operation involving the target. Responsive to the transaction request (and corresponding IID) being associated with an individual data stream of the target the transaction request involving the target can be performed. Responsive to the transaction request being performed via an individual target data stream of the target, the target can transmit a response via the interconnection structure (e.g., via the same individual target data stream) back to the same initiator, for instance, as described in greater detail in FIG. 2A. The individual target data stream can then be associated with a different transaction request (and corresponding IID).

FIG. 4 is a block diagram of an example computer system in which embodiments of the present disclosure may operate. For example, FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the initiator identifier compression circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

The processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to initiator identifier compression circuitry (e.g., the initiator identifier compression circuitry 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

sending a transaction request via parallel target data streams from one or more initiators to one or more targets, wherein the initiators are associated with respective initiator identifiers (IIDs) coupled via an interconnection structure to a target with the respective parallel target data streams;

compressing a quantity IIDs to a sub-set of IIDs;

storing a result of the compression in a translation data structure; and performing, via an individual target data stream of the target data streams, an operation associated with the target and an individual initiator.

2. The method of claim 1, wherein a quantity of respective identifiers of the sub-set of initiators is less than a total quantity of respective identifiers associated with each of the initiators.

3. The method of claim 2, wherein the quantity of respective identifiers of the sub-set of initiators is less than or equal to a quantity of the parallel target data streams.

4. The method of claim 1, wherein the interconnection structure further comprises an interconnection fabric.

5. The method of claim 1, wherein the initiators are grouped into initiator sub-groups, and wherein at least some of the initiator sub-groups include different quantities of initiators.

6. The method of claim 5, wherein at least some of the initiator sub-groups have different priorities, wherein at least some of the initiators in a respective initiator sub-group have different priorities, or both.

7. The method of claim 5, wherein associating the respective identifiers of the sub-set of initiators further comprises associating at least one respective identifier from each of the initiator sub-groups to a respective target data stream of the parallel target data streams.

8. The method of claim 1, wherein the translation data structure is a translation table.

9. The method of claim 1, wherein the sub-set of initiators includes some but not all of the initiators that are coupled to and initiate a transaction request involving the target.

10. An apparatus comprising:

an interconnection structure, wherein;

the interconnection structure includes a tiered interconnection structure having a plurality of initiator identifier (IID) tiers; and wherein an IID compression component and an IID decompression component are located in at least one tier of the plurality of tiers;

initiators coupled via the interconnection structure to a target; and a controller configured to:

receive transaction requests from the initiators;

responsive to receipt of the transaction requests from the initiators, compress a quantity initiator identifiers (IIDs) to a sub-set of IIDs with respective parallel target data streams of the target; and perform, via an individual target data stream of the target data streams, an operation associated with the target and a translated IID of an initiator included in the sub-set of initiators.

11. The apparatus of claim 10, wherein a first IID tier includes a first quantity of IIDs and wherein a second IID tier includes a second quantity of IIDs that is different than the first quantity of IIDs.

12. The apparatus of claim 10, wherein:

the IID compression component is configured to reduce a first quantity of IIDs received at the IID compression component to a second quantity of IIDs transmitted by the IID compression component; and the IID decompression component is configured to increase a quantity of IIDs received at the IID decompression component.

13. The apparatus of claim 10, further comprising a translation table, wherein the translation table includes translation information to translate a first quantity of IIDs to a second quantity of IIDs.

14. An apparatus comprising:

a tiered interconnection structure including a plurality of tiers;

a plurality of initiators coupled via the interconnection structure to a target;

wherein the plurality of initiators are grouped into initiator sub-groups with different data stream priorities, a sub-set of the plurality of initiators having respective initiator identifiers (IIDs) and parallel target data streams of the target associated therewith; and a controller configured to:

receive transaction requests from the plurality of initiators; and perform, via an individual target data stream of the target data streams, an operation associated with the target and a respective translated IID of an initiator included in the sub-set of initiators that has been translated based on information included in a translation table from a respective original IID of the initiator to a final compressed IID.

15. The apparatus of claim 14, wherein the initiators are configured into initiator sub-groups including a first initiator sub-group with a first priority and a second initiator sub-group with a second priority that is different than the first priority.

16. The apparatus of claim 14, wherein an initiator included in the sub-set of initiators has a regular priority, an elevated priority, or a guaranteed priority.

17. The apparatus of claim 14, wherein the target is a memory device, a cache, central processing unit (CPU), a graphical processing unit (GPU), a visual processing unit (VPU), a field-programmable gate array (FPGA), an application-specific circuit (ASIC), an input port of another interconnection structure, or any combination thereof.

18. The apparatus of claim 14, wherein the initiators are controllers, peripheral devices, processing devices, or any combination thereof.

\* \* \* \* \*